United States Patent
Yim et al.

(10) Patent No.: US 7,298,037 B2
(45) Date of Patent: Nov. 20, 2007

(54) STACKED INTEGRATED CIRCUIT PACKAGE-IN-PACKAGE SYSTEM WITH RECESSED SPACER

(75) Inventors: Choong Bin Yim, Seongnam-si (KR); Sungmin Song, Inchon (KR); SeongMin Lee, Seoul (KR); Jaehyun Lim, Seoul (KR); Joungin Yang, Kyongkido (KR); DongSam Park, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 4 days.

(21) Appl. No.: 11/307,722

(22) Filed: Feb. 17, 2006

(65) Prior Publication Data

US 2007/0194423 A1    Aug. 23, 2007

(51) Int. Cl.
*H01L 23/02* (2006.01)

(52) U.S. Cl. .............. 257/686; 257/685; 257/777; 257/E25.006; 257/E25.013; 257/E25.018; 257/E25.021; 257/E25.027; 257/E23.085; 257/E21.614

(58) Field of Classification Search ........... 257/685, 257/686, 777, E25.006, E25.013, E25.018, 257/E25.021, E25.027, E23.085, E21.614; 438/109, FOR. 368, FOR. 426
See application file for complete search history.

(56) References Cited

U.S. PATENT DOCUMENTS

| 6,020,629 | A | 2/2000 | Farnworth et al. | 257/686 |
|---|---|---|---|---|
| 6,972,481 | B2 | 12/2005 | Karnezos | 257/686 |
| 2005/0269682 | A1 | 12/2005 | Onodera et al. | 257/686 |
| 2005/0269692 | A1 | 12/2005 | Kwon et al. | 257/723 |
| 2005/0277228 | A1 | 12/2005 | Lee | 438/113 |
| 2006/0249851 | A1* | 11/2006 | Karnezos | 257/777 |

* cited by examiner

*Primary Examiner*—Jasmine Clark
(74) *Attorney, Agent, or Firm*—Mikio Ishimaru (57) ABSTRACT

A stacked integrated circuit package-in-package system is provided forming a first integrated circuit spacer package including a mold compound with a recess provided therein, stacking the first integrated circuit spacer package on an integrated circuit die on a substrate with the recess positioned therebetween, and attaching a first electrical interconnect extending from the recess and connected between the integrated circuit die and the substrate.

15 Claims, 8 Drawing Sheets

STACKED INTEGRATED CIRCUIT PACKAGE-IN-PACKAGE SYSTEM WITH RECESSED SPACER

TECHNICAL FIELD

The present invention relates generally to integrated circuit packages and more particularly to stacked integrated circuit package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, heat dissipation, and cost reduction.

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

Thus, a need still remains for a stacked integrated circuit package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package-in-package system including forming a first integrated circuit spacer package including a mold compound with a recess provided therein, stacking the first integrated circuit spacer package on an integrated circuit die on a substrate with the recess positioned therebetween, and attaching a first electrical interconnect extending from the recess and connected between the integrated circuit die and the substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
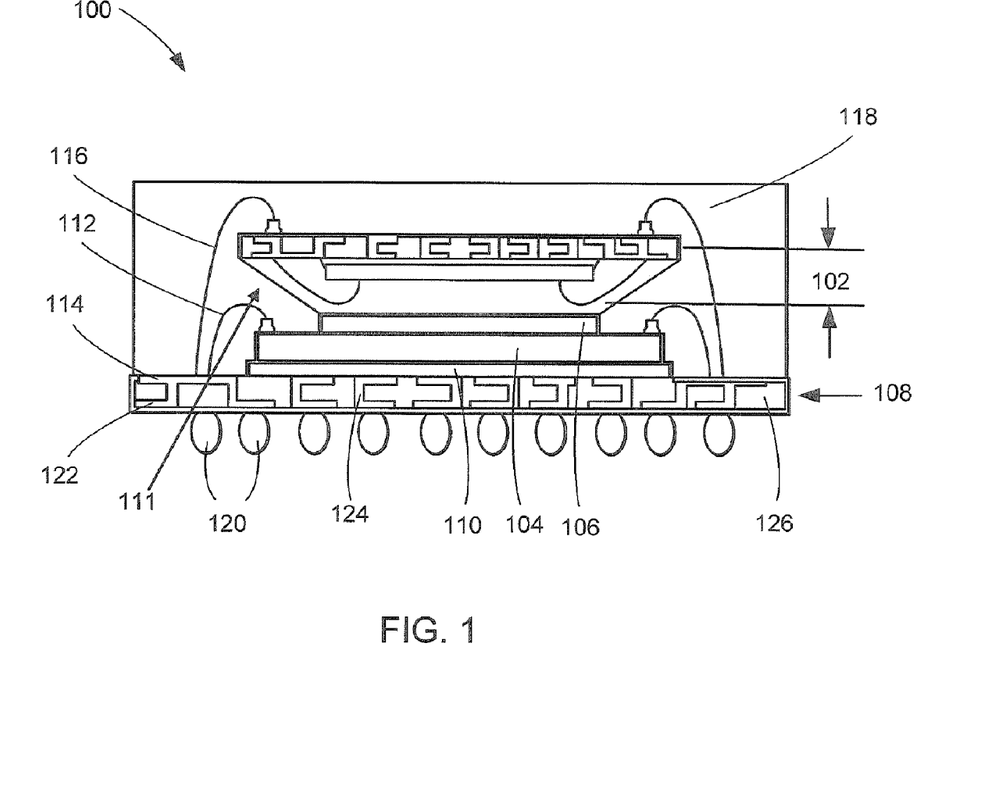
FIG. 1 is a cross-sectional view of a stacked integrated circuit package-in-package system in an embodiment of the present invention.

Referring now to FIG. 1, therein is shown a cross-sectional view of a stacked integrated circuit package-in-package system 100 in an embodiment of the present invention. An integrated circuit spacer package 102 stacks above an integrated circuit die 104, such as a wire bond integrated circuit, wherein the integrated circuit spacer package 102 attaches to the integrated circuit die 104 with a stacking adhesive 106. The integrated circuit die 104 attaches to a substrate 108, such as an organic or inorganic substrate, with a die-attach adhesive 110.

The integrated circuit spacer package 102 serves as a spacer for the stacked configuration and forms a recess 111 for first electrical interconnects 112, such as bond wires, to attach the integrated circuit die 104 to a top metal layer 114 of the substrate 108. Second electrical interconnects 116, such as bond wires, attach to the integrated circuit spacer package 102 to the top metal layer 114. For illustrative purpose, the integrated circuit die 104 is shown as a bare die, although it is understood that the integrated circuit die 104 may not be bare die.

A package mold 118, such as an over mold, encapsulates the integrated circuit spacer package 102, the integrated circuit die 104, the first electrical interconnects 112, and the second electrical interconnects 116 to a top of the substrate 108. External interconnects 120, such as solder balls, attach to a bottom metal layer 122 of the substrate 108 at a bottom of the substrate 108 for connections to the next system level (not shown), such as a printed circuit board.

Electrical vias 124 connect traces of the top metal layer 114 to the bottom metal layer 122. An insulator 126, such as a dielectric, isolates the traces of the top metal layer 114 from each other, the traces of the bottom metal layer 122 from each other, the electrical vias 124 from each other, and the top metal layer 114 with the bottom metal layer 122 as well as provides structural support for the substrate 108. For illustrative purpose, the substrate 108 is shown as having two layers of metal, although it is understood that the number layers may differ.

It has been discovered that the integrated circuit spacer package 102 serving as a spacer for a stacked configuration for numerous integrated circuits eliminates the need separate spacers, such as a silicon spacer, forming a lower height of the stacked integrated circuit package-in-package system 100. The integrated circuit spacer package 102 improves manufacturing yield and reduces cost of the stacked integrated circuit package-in-package system 100 by simplifying and reducing the manufacturing process.

Figure 2:
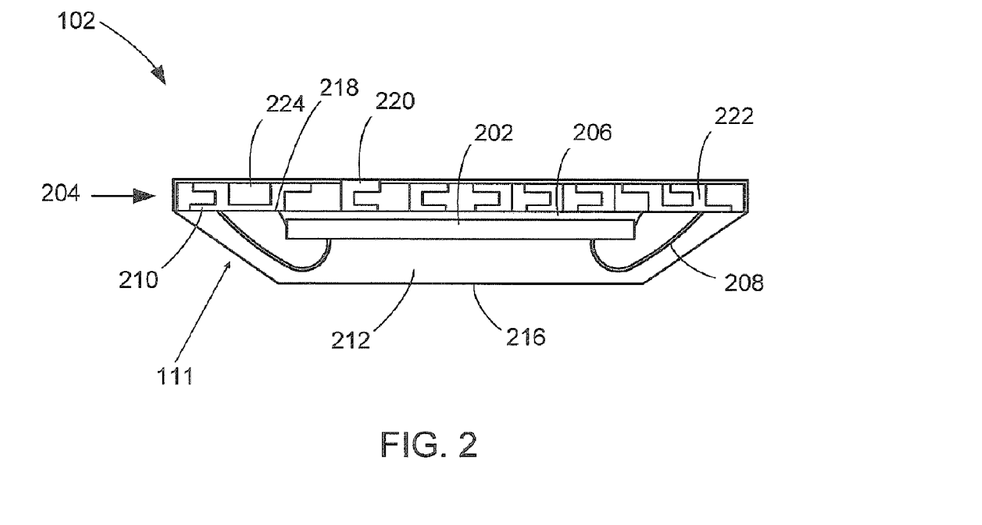
FIG. 2 is a more detailed cross-sectional view of the integrated circuit spacer package.

Referring now to FIG. 2, therein is shown a more detailed cross-sectional view of the integrated circuit spacer package 102. The integrated circuit spacer package 102 includes an integrated circuit die 202 attached to a carrier 204, such as an organic or inorganic carrier, with an adhesive 206. Electrical structures 208, such as bond wires, connect the integrated circuit die 202 to a first metal layer 210 of the carrier 204.

A mold compound 212 encapsulates and protects the integrated circuit die 202 and electrical interconnects 214. The mold compound 212 forms a spacer structure such that an attachment side 216 of the mold compound 212, used for stacking attachment, is narrower than a carrier side 218 of the mold compound 212. A width and a length of the carrier side 218 is substantially the same as a width and a length of the carrier 204, respectively. A width and a length of the attachment side 216 is less than the width and the length of the carrier side 218, respectively, forming the predetermined clearance for the first electrical interconnects 112 of FIG. 1. For illustrative purpose, the horizontal dimensions of the carrier side 218 is shown as substantially same as the horizontal dimensions of the carrier 204, although it is understood that the horizontal dimensions of the carrier side 218 and the horizontal dimensions of the carrier 204 may not be substantially same.

The spacer structure of the mold compound 212 may be formed with the sides of the mold compound 212 from the carrier side 218 to the attachment side 216 having an obtuse angle, a curved configuration, or a stepped or tapered configuration forming a terrace structure. Other spacer structures of the mold compound 212 are possible forming the predetermined clearance.

The integrated circuit spacer package 102 is the package inside the stacked integrated circuit package-in-package system 100 of FIG. 1. The mold compound 212 also protects the integrated circuit spacer package 102 withstanding the stacking process and the encapsulation process forming the stacked integrated circuit package-in-package system 100.

The carrier 204 includes a second metal layer 220 for connections of the integrated circuit spacer package 102 to the substrate 108 of FIG. 1. Electrical vias 222 connect traces of the first metal layer 210 to the second metal layer 220. An insulator 224, such as a dielectric, isolates the traces of the first metal layer 210 from each other, the traces of the second metal layer 220 from each other, the electrical vias 222 from each other, and the first metal layer 210 with the second metal layer 220 as well as provides structural support for the carrier 204.

For illustrative purpose, the integrated circuit die 202 is shown as a bare die, although it is understood that the integrated circuit die 202 may not be bare. Also for illustrative purpose, the carrier 204 is shown as having two layers of metal, although it is understood that the number layers may differ. Further for illustrative purpose, the integrated circuit spacer package 102 is shown not having stacked integrated circuits, although it is understood that the integrated circuit spacer package 102 may also have stacked integrated circuits as well as may have package-in-package configuration.

Figure 3:
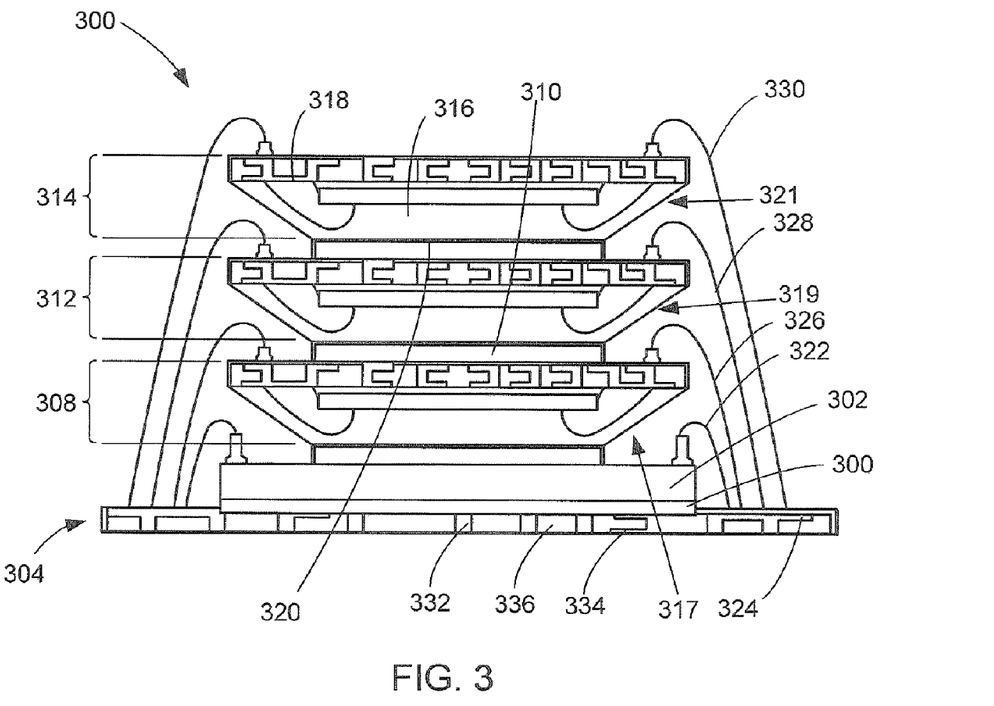
FIG. 3 is a cross-sectional view of a stacked integrated circuit package-in-package system without a package mold in an alternative embodiment of the present invention.

Referring now to FIG. 3, therein is shown a cross-sectional view of a stacked integrated circuit package-in-package system 300 without a package mold in an alternative embodiment of the present invention. An integrated circuit die 302 attaches to a substrate 304 with a die-attach adhesive 306. A first integrated circuit spacer package 308 stacks on the integrated circuit die 302 with a stacking adhesive 310. A second integrated circuit spacer package 312 stacks on the first integrated circuit spacer package 308 and a third integrated circuit spacer package 314 on the second integrated circuit spacer package 312 with the stacking adhesive 310.

The first integrated circuit spacer package 308, the second integrated circuit spacer package 312, and the third integrated circuit spacer package 314 are of similar structure to the integrated circuit spacer package 102 of FIG. 2. A mold compound 316 of the first integrated circuit spacer package 308 forms a first recess 317, such as a beveled or chamfered form, between the integrated circuit die 302 and the first integrated circuit spacer package 308. The mold compound 316 of the second integrated circuit spacer package 312 forms a second recess 319, such as a beveled or chamfered form, between the first integrated circuit spacer package 308 and the second integrated circuit spacer package 312. The mold compound 316 of the third integrated circuit spacer package 314 forms a third recess 321, such as a beveled or chamfered form, between the second integrated circuit spacer package 312 and the third integrated circuit spacer package 314.

The mold compound 316 of the first integrated circuit spacer package 308, the second integrated circuit spacer package 312, and the third integrated circuit spacer package 314 has sides of the mold compound 316 in an obtuse angle forming a trapezoid shape. The base of the trapezoid is a carrier side 318 of the mold compound 316 and a top of the trapezoid is an attachment side 320 of the mold compound 316. A width and a length of the attachment side 320 is less than the width and the length of the carrier side 318, respectively.

The first integrated circuit spacer package 308 serves as a spacer for first electrical interconnects 322, such as bond wires, extending from the first recess 317 to attach the integrated circuit die 302 and a top metal layer 324 of the substrate 304. The second integrated circuit spacer package 312 serves as a spacer for second electrical interconnects 326, such as bond wires, extending from the second recess 319 to attach the first integrated circuit spacer package 308 and the top metal layer 324. The third integrated circuit spacer package 314 serves as a spacer for third electrical interconnects 328, such as bond wires, extending from the third recess 321 to attach the second integrated circuit spacer package 312 to the top metal layer 324. Fourth electrical interconnects 330, such as bond wires, attach to the third integrated circuit spacer package 314 to the top metal layer 324.

For illustrative purpose, the first integrated circuit spacer package 308, the second integrated circuit spacer package 312, and the third integrated circuit spacer package 314 are described as substantially the same, although it is understood that the first integrated circuit spacer package 308, the second integrated circuit spacer package 312, and the third integrated circuit spacer package 314 may be different. Also for illustrative purpose, the stacked configuration is shown with the first integrated circuit spacer package 308, the second integrated circuit spacer package 312, the third integrated circuit spacer package 314, and the integrated circuit die 302, although it is understood that different structures may be used in the stacked integrated circuit package-in-package system 300.

Electrical vias 332 connect traces of the top metal layer 324 to a bottom metal layer 334. An insulator 336, such as a dielectric, isolates the traces of the top metal layer 324 from each other, the traces of the bottom metal layer 334 from each other, the electrical vias 332 from each other, and the top metal layer 324 with the bottom metal layer 334 as well as provides structural support for the substrate 304. For illustrative purpose, the substrate 304 is shown as having two layers of metal, although it is understood that the number layers may differ.

Figure 4:
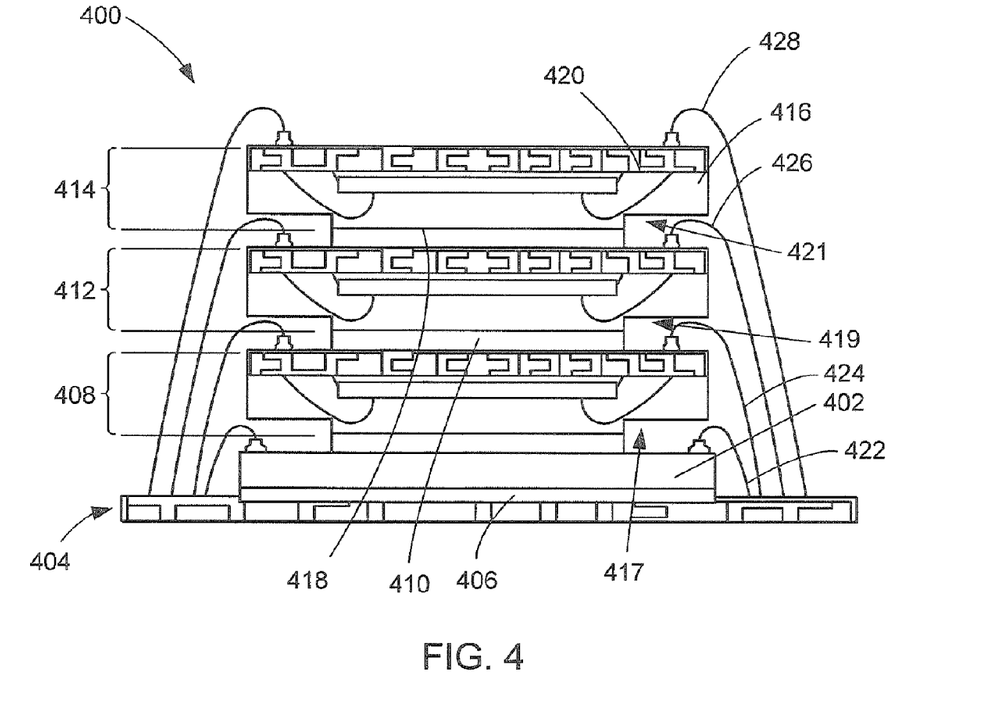
FIG. 4 is a cross-sectional view of a stacked integrated circuit package-in-package system without a package mold in another alternative embodiment of the present invention.

Referring now to FIG. 4, therein is shown a cross-sectional view of a stacked integrated circuit package-in-package system 400 without a package mold in another alternative embodiment of the present invention. Similarly, an integrated circuit die 402 attaches to a substrate 404 with a die-attach adhesive 406. A first integrated circuit spacer package 408 stacks on the integrated circuit die 402 with a stacking adhesive 410. A second integrated circuit spacer package 412 stacks on the first integrated circuit spacer package 408 and a third integrated circuit spacer package 414 on the second integrated circuit spacer package 412 with the stacking adhesive 410.

The first integrated circuit spacer package 408, the second integrated circuit spacer package 412, and the third integrated circuit spacer package 414 are of similar structure to the integrated circuit spacer package 102 of FIG. 2. A mold compound 416 of the first integrated circuit spacer package 308 forms a first recess 417, such as a stepped or terrace form, between the integrated circuit die 402 and the first integrated circuit spacer package 408. The mold compound 416 of the second integrated circuit spacer package 412 forms a second recess 419, such as a stepped or terrace form, between the first integrated circuit spacer package 408 and the second integrated circuit spacer package 412. The mold compound 416 of the third integrated circuit spacer package 414 forms a third recess 421, such as a stepped or terrace form, between the second integrated circuit spacer package 412 and the third integrated circuit spacer package 414.

The mold compound 416 of the first integrated circuit spacer package 408, the second integrated circuit spacer package 412, and the third integrated circuit spacer package 414 has sides of the mold compound 416 forming a trapezoid shape. The base of the trapezoid is a carrier side 418 of the mold compound 416 and a top of the trapezoid is an attachment side 420 of the mold compound 416. A width and a length of the attachment side 420 is less than the width and the length of the carrier side 418, respectively.

The first integrated circuit spacer package 408 serves as a spacer for first electrical interconnects 422, such as bond wires, extending from the first recess 417 to attach the integrated circuit die 402 and the substrate 404. The second integrated circuit spacer package 412 serves as a spacer for second electrical interconnects 424, such as bond wires, extending from the second recess 419 to attach the first integrated circuit spacer package 408 and the substrate 404. The third integrated circuit spacer package 414 serves as a spacer for third electrical interconnects 426, such as bond wires, extending from the third recess 421 to attach the second integrated circuit spacer package 412 to the substrate 404. Fourth electrical interconnects 428, such as bond wires, attach to the third integrated circuit spacer package 414 to the substrate 404.

Figure 5:
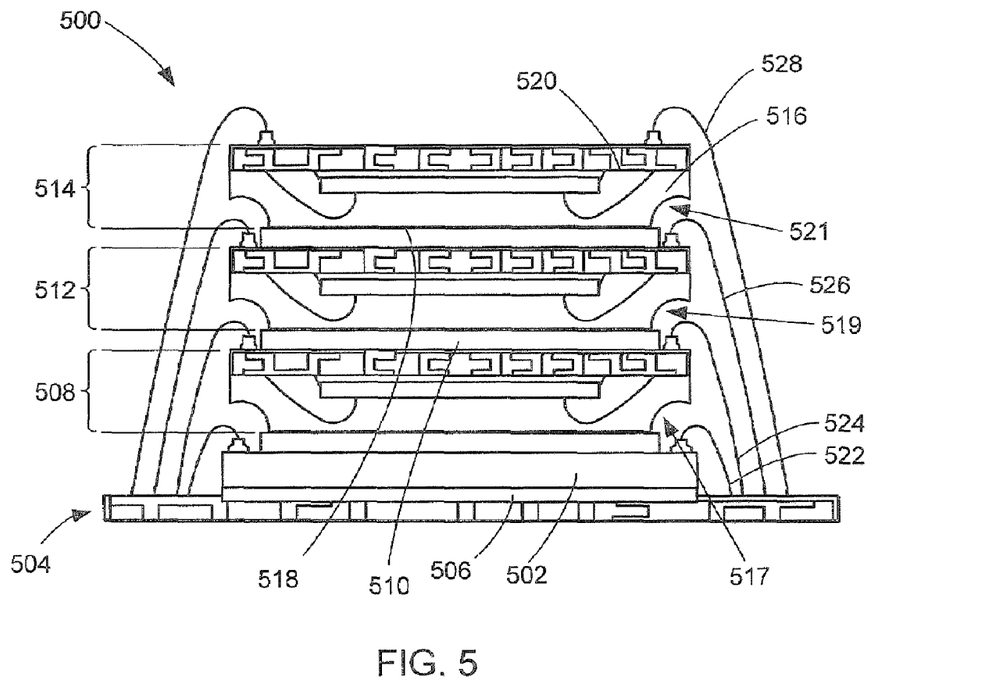
FIG. 5 is a cross-sectional view of a stacked integrated circuit package-in-package system without a package mold in yet another alternative embodiment of the present invention.

Referring now to FIG. 5, therein is shown a cross-sectional view of a stacked integrated circuit package-in-package system 500 without a package mold in yet another alternative embodiment of the present invention. Similarly, an integrated circuit die 502 attaches to a substrate 504 with a die-attach adhesive 506. A first integrated circuit spacer package 508 stacks on the integrated circuit die 502 with a stacking adhesive 510. A second integrated circuit spacer package 512 stacks on the first integrated circuit spacer package 508 and a third integrated circuit spacer package 514 on the second integrated circuit spacer package 512 with the stacking adhesive 510.

The first integrated circuit spacer package 508, the second integrated circuit spacer package 512, and the third integrated circuit spacer package 514 are of similar structure to the integrated circuit spacer package 102 of FIG. 2. A mold compound 516 of the first integrated circuit spacer package 508, the second integrated circuit spacer package 512, and the third integrated circuit spacer package 514 has sides of the mold compound 516 in a curved configuration. A width and a length of an attachment side 518 of the mold compound 516 is less than the width and the length of a carrier side 520 of the mold compound 516, respectively.

The first integrated circuit spacer package 508, the second integrated circuit spacer package 512, and the third integrated circuit spacer package 514 serve as spacers for first electrical interconnects 522, second electrical interconnects 524, and third electrical interconnects 526 extending from a first recess 517, a second recess 519, and a third recess 521, respectively. Fourth electrical interconnects 528 attach to the third integrated circuit spacer package 514 to the substrate 504.

Figure 6:
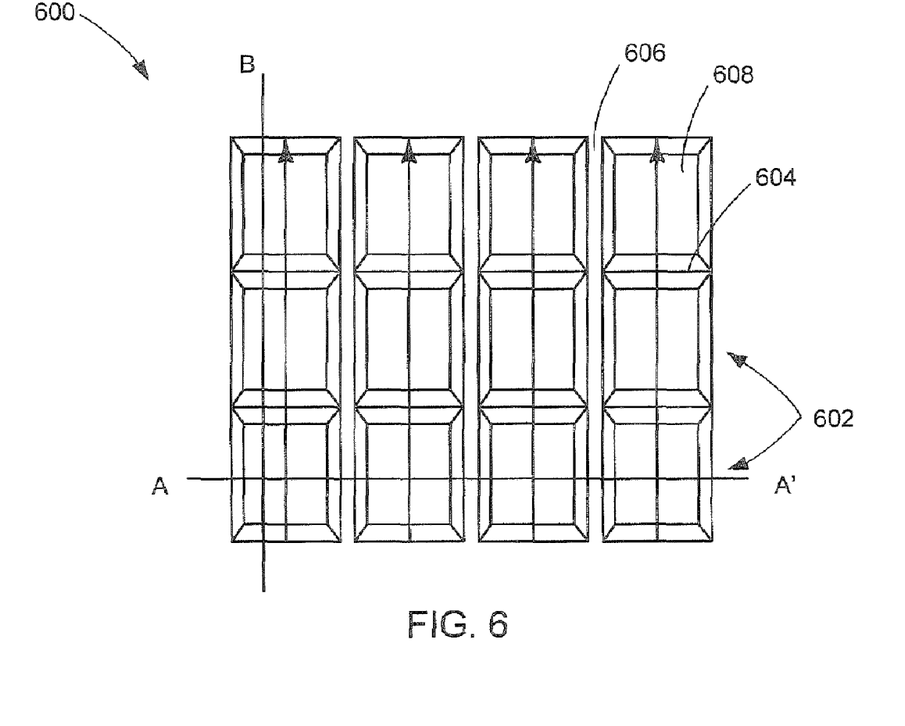
FIG. 6 is a top view of a first array of an integrated circuit spacer package.

Referring now to FIG. 6, therein is shown a top view of a first array 600 of an integrated circuit spacer package 602. The integrated circuit spacer package 602 is similar to the integrated circuit spacer package 102 of FIG. 2. A mold compound 608 of the integrated circuit spacer package 602 along an ordinate or the line B-B' is connected to another with a channel 604 in between. The mold compound 608 of the integrated circuit spacer package 602 along an abscissa or the line A-A' is not connected to another with a space 606 in between. The mold compound 608 flows along the ordinate direction during encapsulation.

Figure 7:
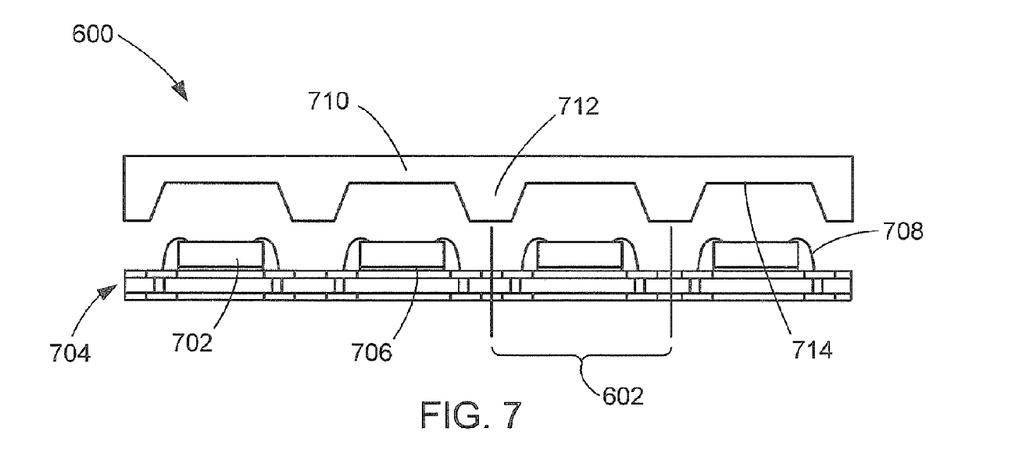
FIG. 7 is a cross-sectional view of the first array of the integrated circuit spacer package in a molding phase along a line A-A' of FIG. 6.

Referring now to FIG. 7, therein is shown a cross-sectional view of the first array 600 of the integrated circuit spacer package 602 in a molding phase along a line A-A' of FIG. 6. The first array 600 has an integrated circuit die 702 next to another with each attached to a carrier 704 with a die-attach adhesive 706. Electrical interconnects 708, such as bond wires, connect the integrated circuit die 702 to the carrier 704.

A top mold plate 710 includes an isolation mask 712 forming the space 606 of FIG. 6 during encapsulation of the mold compound 608 of FIG. 6. The top mold plate 710 having the isolation mask 712 aligns with the location of the integrated circuit die 702 in the first array 600 such that the isolation mask 712 does not damage the electrical interconnects 708. The isolation mask 712 and another adjacent one form an isolation recess 714 in a predetermined geometric shape of a trapezoid. The carrier 704 is exposed under the isolation mask 712.

Figure 8:
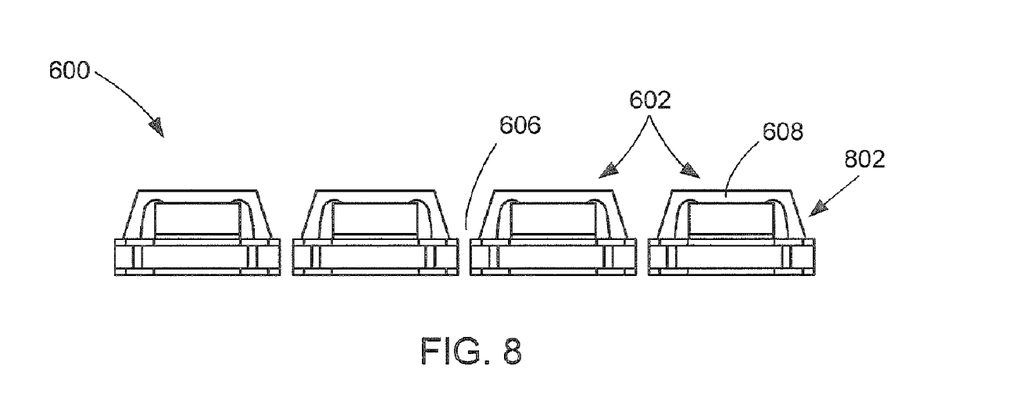
FIG. 8 is a cross-sectional view of the first array of the integrated circuit spacer package in a singulation phase along the line A-A' of FIG. 6.

Referring now to FIG. 8, therein is shown is a cross-sectional view of the first array 600 of the integrated circuit spacer package 602 in a singulation phase along the line A-A' of FIG. 6. The first array 600 is singulated forming instances of the integrated circuit spacer package 602 with in the mold compound 608. The space 606 serves as an area for singulation without damaging the mold compound 608 and the integrated circuit spacer package 602. The mold compound 608 provides a recess 802 for electrical connections in a stacked configuration.

Figure 9:
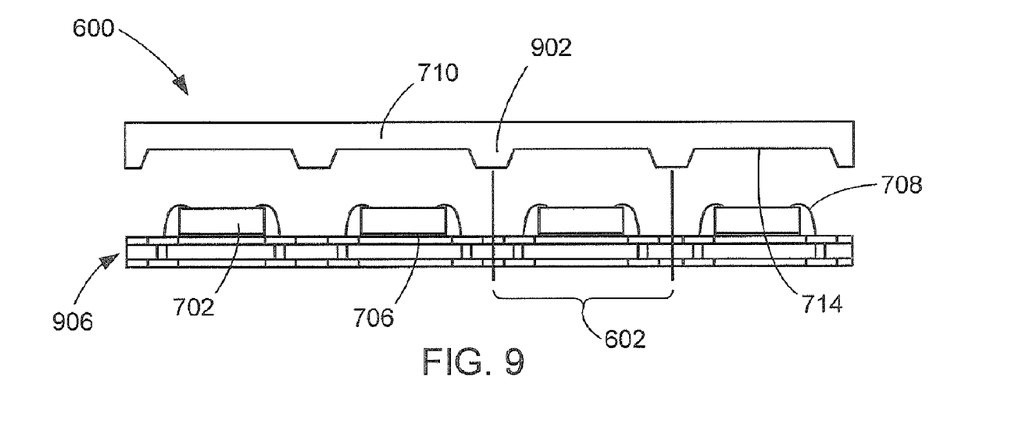
FIG. 9 is a cross-sectional view of the first array of the integrated circuit spacer package in the molding phase of FIG. 7 along a line B-B' of FIG. 6.

Referring now to FIG. 9, therein is shown a cross-sectional view of the first array 600 of the integrated circuit spacer package 602 in the molding phase of FIG. 7 along a line B-B' of FIG. 6. The top mold plate 710 having a channel mask 902 aligns with the location of the integrated circuit die 702 in the first array 600 such that the channel mask 902 does not damage the electrical interconnects 708. The channel mask 902 and another adjacent one form a channel recess 904 in a predetermined geometric shape of a trapezoid. The mold compound 608 flows through the top mold plate along the line B-B' encapsulating the integrated circuit die 702 and the electrical interconnects 708 to a carrier 906 as well as filling the isolation recess 714 and the channel recess 904. The mold compound 608 is below the channel mask 902 forms the channel 604 and covers the carrier 906 below the channel mask 902.

Figure 10:
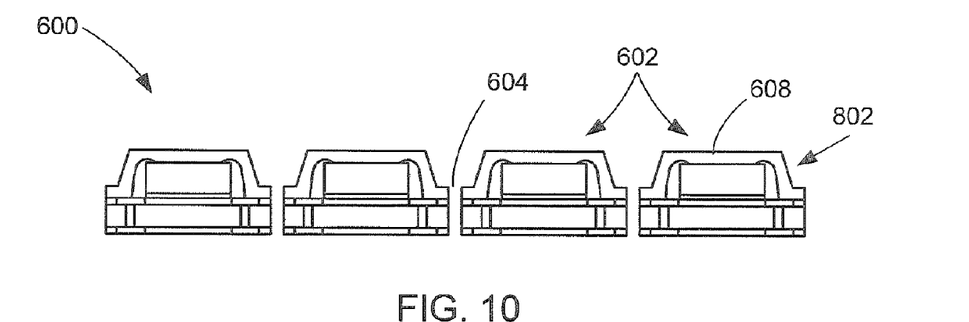
FIG. 10 is a cross-sectional view for the first array of the integrated circuit spacer package in a singulation phase of FIG. 8 along the line B-B' of FIG. 6.

Referring now to FIG. 10, therein is shown a cross-sectional view for the first array 600 of the integrated circuit spacer package 602 in a singulation phase of FIG. 8 along the line B-B' of FIG. 6. The first array 600 is singulated forming instances of the integrated circuit spacer package 602 with in the mold compound 608. The channel 604 serves as an area for singulation without damaging the integrated circuit spacer package 602. The mold compound 608 provides the recess 802 for electrical connections in a stacked configuration.

Figure 11:
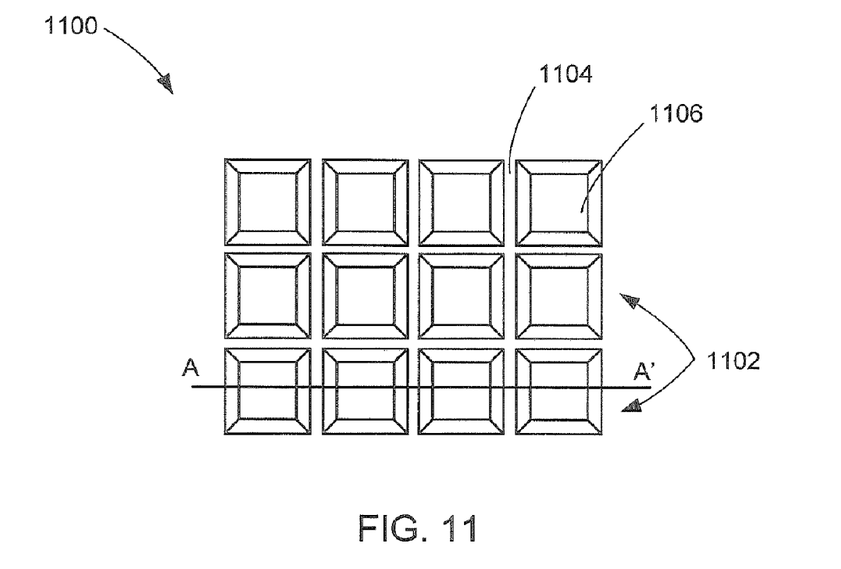
FIG. 11 is a top view of a second array of an integrated circuit spacer package.

Referring now to FIG. 11, therein is shown a top view of a second array 1100 of an integrated circuit spacer package 1102. The integrated circuit spacer package 1102 is similar to the integrated circuit spacer package 102 of FIG. 2. A mold compound 1106 of the integrated circuit spacer package 1102 in the second array 1100 is not connected to another with a space 1104 in between. The mold compound 1106 protects the integrated circuit spacer package 1102.

Figure 12:
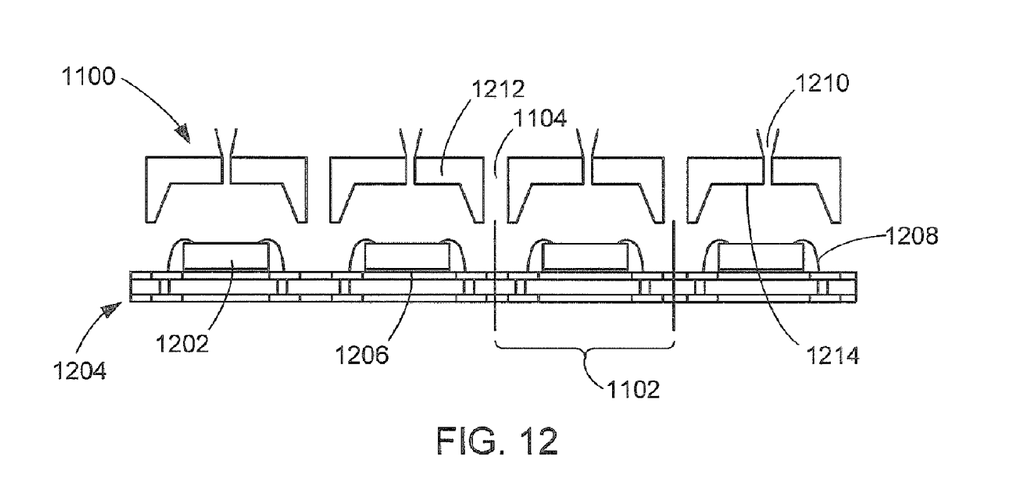
FIG. 12 is a cross-sectional view of the second array of the integrated circuit spacer package in a molding phase along a line A-A' of FIG. 11.

Referring now to FIG. 12, therein is shown a cross-sectional view of the second array 1100 of the integrated circuit spacer package 1102 in a molding phase along a line A-A' of FIG. 11. The second array 1100 has an integrated circuit die 1202 next to another with each attached to a carrier 1204 with a die-attach adhesive 1206. Electrical interconnects 1208, such as bond wires, connect the integrated circuit die 702 to the carrier 704. Each of the integrated circuit die 1202 having the electrical interconnects 1208 in the second array 1100 are encapsulated with the mold compound 1106 of FIG. 11 inserted through an injection hole 1210 of an individual mold cap 1212 and forming the space 1104 between instances of the integrated circuit spacer package 1102. The space 1104 leaves the carrier 1204 exposed. The individual mold cap 1212 has a mold recess 1214 in a predetermined geometric shape of a trapezoid.

Figure 13:
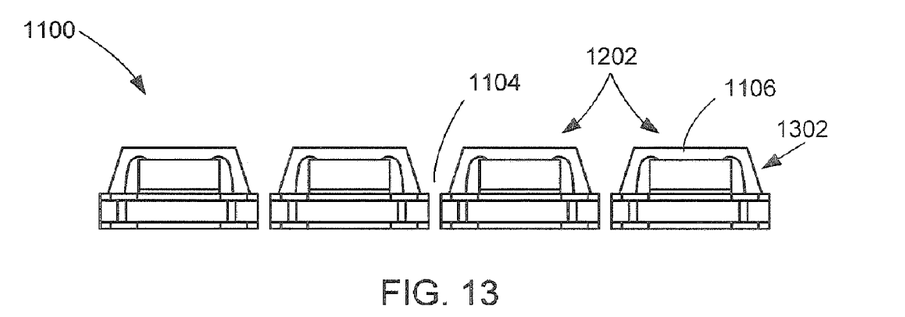
FIG. 13 is a cross-sectional view of the second array of the integrated circuit spacer package in a singulation phase along the line A-A' of FIG. 11.

Referring now to FIG. 13, therein is shown a cross-sectional view of the second array 1100 of the integrated circuit spacer package 1102 in a singulation phase along the line A-A' of FIG. 11. The second array 1100 is singulated forming instances of the integrated circuit spacer package 1102 with in the mold compound 1106. The space 1104 serves as an area for singulation without damaging the mold compound 1106 and the integrated circuit spacer package 1102. The mold compound 1106 provides a recess 1302 for electrical connections in a stacked configuration.

Figure 14:
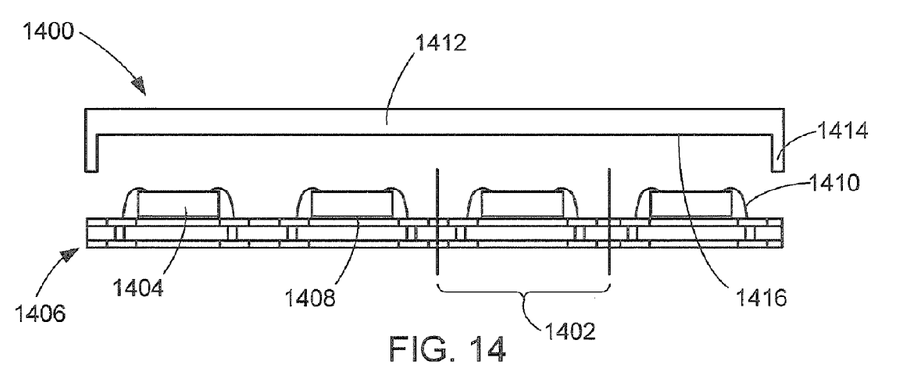
FIG. 14 is a cross-sectional view of a third array of the integrated circuit spacer package in a molding phase.

Referring now to FIG. 14, therein is shown a cross-sectional view of a third array 1400 of an integrated circuit spacer package 1402 in a molding phase. The third array 1400 has an integrated circuit die 1404 next to another with each attached to a carrier 1406 with a die-attach adhesive 1408. Electrical interconnects 1410, such as bond wires, connect the integrated circuit die 1404 to the carrier 1406.

A planar mold cap 1412 includes an end mask 1414 for each end of the third array 1400 forming boundaries during encapsulation. The planar mold cap 1412 having the end mask 1414 aligns with the location of the integrated circuit die 702 in the third array 1400 such that the end mask 1414 does not damage the electrical interconnects 1410. The end mask 1414 at each end of the planar mold cap 1412 forms a molding recess 1416.

Figure 15:
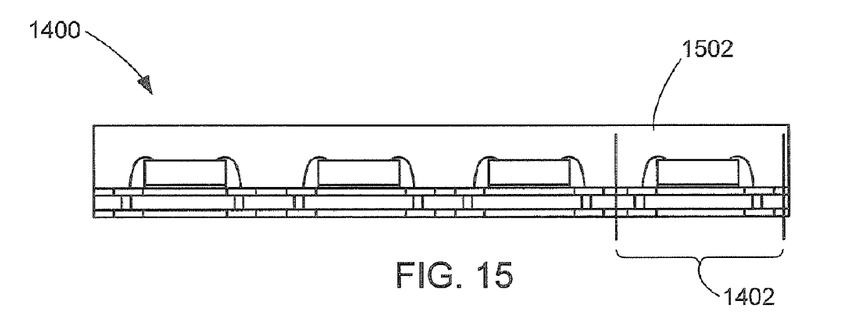
FIG. 15 is a cross-sectional view of the third array of the integrated circuit spacer package encapsulated.

Referring now to FIG. 15, therein is shown a cross-sectional view of the third array 1400 of the integrated circuit spacer package 1402 encapsulated. A mold compound 1502 having the shape defined by the molding recess 1416 of FIG. 14 covers the third array 1400. The cross-sectional view shows the mold compound 1502 in a predetermined geometric shape of a rectangle.

Figure 16:
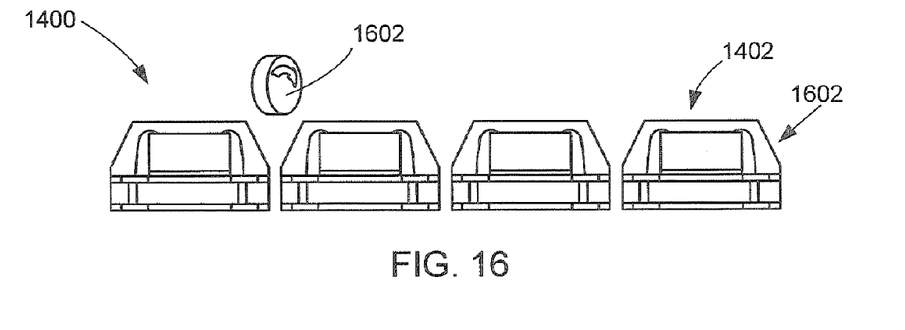
FIG. 16 is a cross-sectional view of the third array of the integrated circuit spacer package in a singulation phase.

Referring now to FIG. 16, therein is shown a cross-sectional view of the third array 1400 of the integrated circuit spacer package 1402 in a singulation phase. A saw 1602 singulates the third array 1400 forming instances of the integrated circuit spacer package 1402. The integrated circuit spacer package 1402 is similar to the integrated circuit spacer package 102 of FIG. 2.

Figure 17:
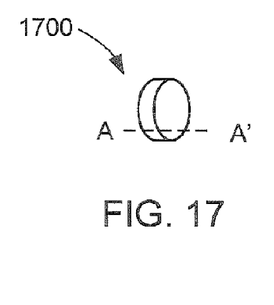
FIG. 17 is a cross-sectional view a first saw.

Referring now to FIG. 17, therein is shown a cross-sectional view of a first saw 1700. The first saw 1700 is circular having a thinness sufficient for singulation. The predetermined geometric shape and precision of the first saw 1700 and singulation process contribute to the predetermined geometric structure of a mold compound 1702 of FIG. 2 of the integrated circuit spacer package 102 of FIG. 2.

Figure 18:
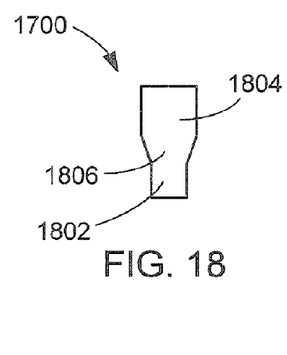
FIG. 18 is a side view of the first saw having an edge along a line A-A' of FIG. 17.

Referring now to FIG. 18, therein is shown a side view of the first saw 1700 having an edge 1802 along a line A-A' of FIG. 17. The first saw 1700 having the edge 1802, a central region 1804, and a transition region 1806 having an obtuse angle connecting a width of the central region 1804 to a thinner width of the edge 1802.

Figure 19:
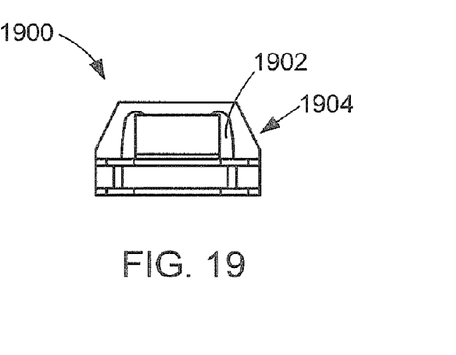
FIG. 19 is a cross-sectional view of an integrated circuit spacer package singulated with the first saw of FIG. 17.

Referring now to FIG. 19, therein is shown a cross-sectional view of an integrated circuit spacer package 1900 singulated with the first saw 1700 of FIG. 17. The edge 1802 of FIG. 18 forms a recess 1904 of a mold compound 1902 of the integrated circuit spacer package 1900 in a trapezoid structure. The integrated circuit spacer package 1900 is similar to the integrated circuit spacer package 102 of FIG. 2.

Figures 20, 21:
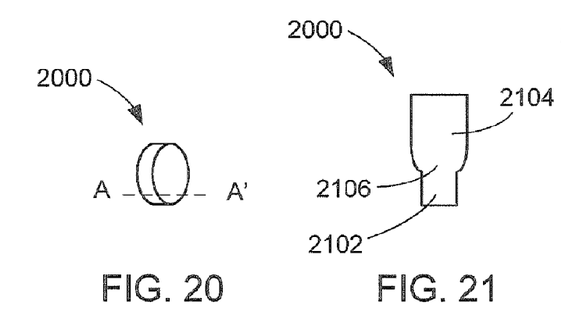
FIG. 20 is a cross-sectional view of a second saw.
FIG. 21 is a side view of the second saw having an edge along a line A-A' of FIG. 20.

Referring now to FIG. 20, therein is shown a cross-sectional view of a second saw 2000. The second saw 2000 is circular having a thinness sufficient for singulation. The predetermined geometric shape and precision of the second saw 2000 and singulation process contribute to the predetermined geometric structure of the mold compound 1702 of FIG. 2 of the integrated circuit spacer package 102 of FIG. 2.

Referring now to FIG. 21, therein is shown a side view of the second saw 2000 having an edge 2102 along a line A-A' of FIG. 20. The second saw 2000 having the edge 2102, a central region 2104, and a transition region 2106 having curves connecting a width of the central region 2104 to a thinner width of the edge 2102.

Figure 22:
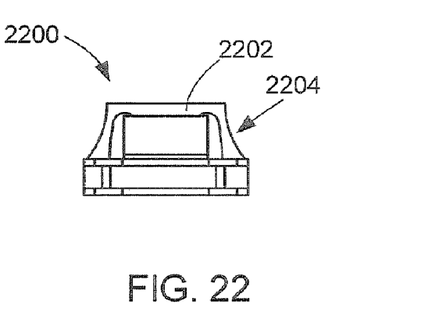
FIG. 22 is a cross-sectional view of an integrated circuit spacer package singulated with the second saw of FIG. 20.

Referring now to FIG. 22, therein is shown a cross-sectional view of an integrated circuit spacer package 2200 singulated with the second saw 2000 of FIG. 20. The edge 2102 of FIG. 21 forms a recess 2204 of a mold compound 2202 of the integrated circuit spacer package 2200 in a predetermined geometric structure having curved sides. The integrated circuit spacer package 2200 is similar to the integrated circuit spacer package 102 of FIG. 2.

Figure 23:
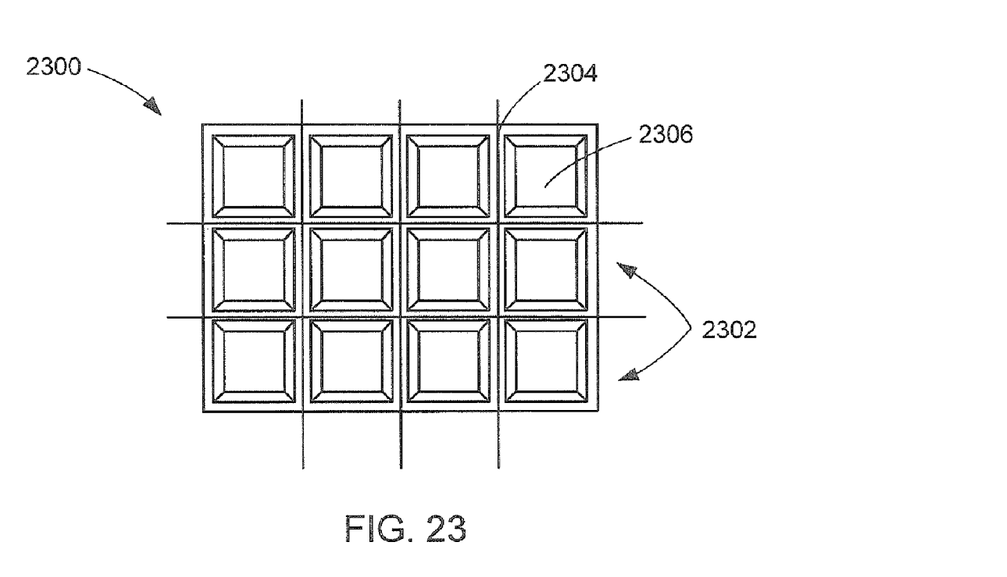
FIG. 23 is a top view of fourth array of an integrated circuit spacer package.

Referring now to FIG. 23, therein is shown a top view of a fourth array 2300 of an integrated circuit spacer package 2302. The integrated circuit spacer package 2302 is similar to the integrated circuit spacer package 102 of FIG. 2. A mold compound 2306 of the integrated circuit spacer package 2302 is connected to another with a channel 2304 in between. The mold compound 2306 protects the integrated circuit spacer package 2302.

Figure 24:
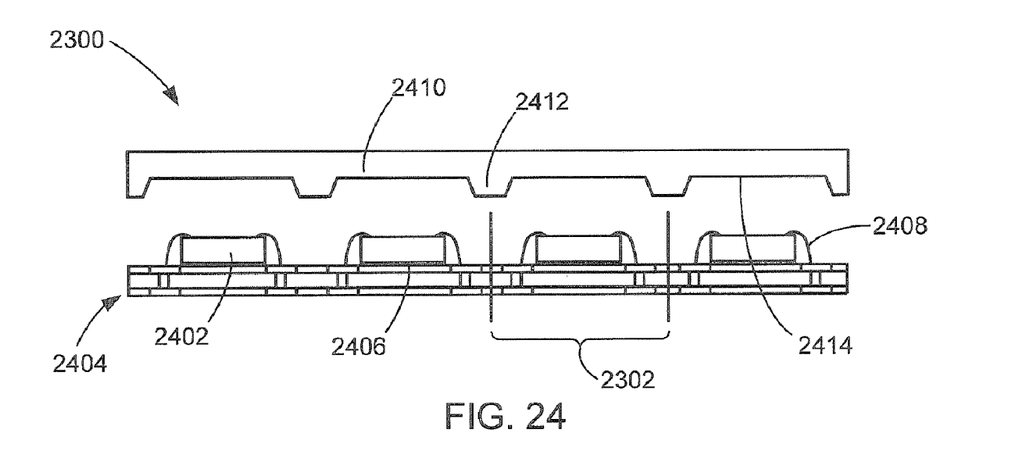
FIG. 24 is a cross-sectional view of fourth array of the integrated circuit spacer package in a molding phase.

Referring now to FIG. 24, therein is shown a cross-sectional view of the fourth array 2300 of the integrated circuit spacer package 2302 in a molding phase. The fourth array 2300 has an integrated circuit die 2402 next to another with each attached to a carrier 2404 with a die-attach adhesive 2406. Electrical interconnects 2408, such as bond wires, connect the integrated circuit die 2402 to the carrier 2404.

A top mold plate 2410 having a channel mask 2412 aligns with the location of the integrated circuit die 2402 in the fourth array 2300 such that the channel mask 2412 does not damage the electrical interconnects 2408. The channel mask 2412 and another adjacent one form a channel recess 2414 in a predetermined geometric shape of a trapezoid. The mold compound 2306 fills the channel recess 2414 encapsulating the integrated circuit die 2402 and the electrical interconnects 2408 to the carrier 2404. The mold compound 2306 below the channel mask 2412 forms the channel 2304 and covers the carrier 2404 below the channel mask 2412.

Figure 25:
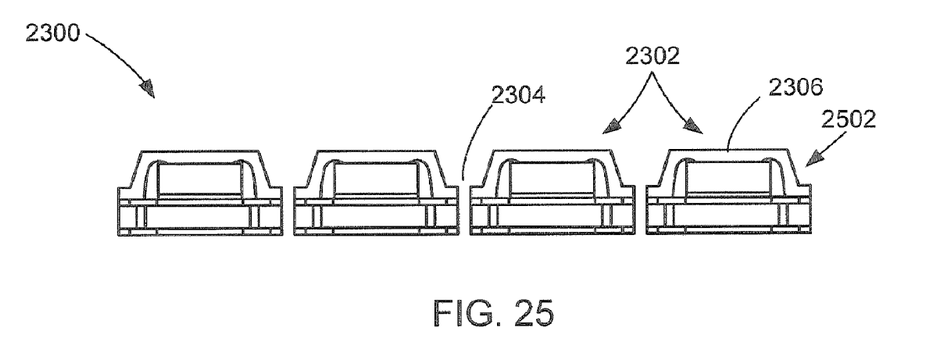
FIG. 25 is a cross-sectional view of fourth array of the integrated circuit spacer package in a singulation phase.

Referring now to FIG. 25, therein is shown a cross-sectional view of the fourth array 2300 of the integrated circuit spacer package 2302 in a singulation phase. The fourth array 2300 is singulated forming instances of the integrated circuit spacer package 2302 with in the mold compound 2306. The channel 2304 serves as an area for singulation without damaging the mold compound 2306 and the integrated circuit spacer package 2302. The mold compound 2306 provides a recess 2502 for electrical connections in a stacked configuration.

Figure 26:
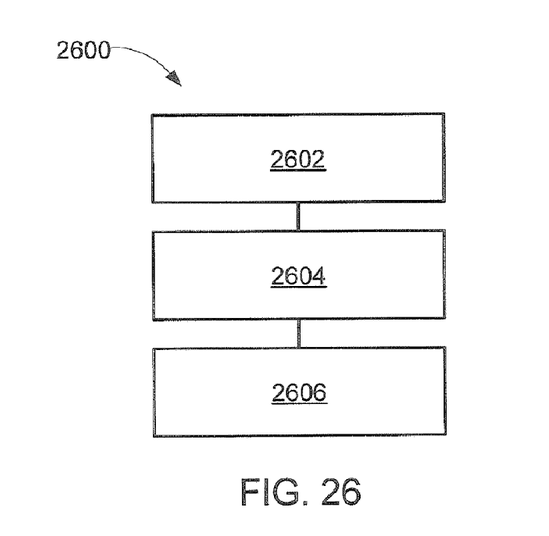
FIG. 26 is a flow chart of a stacked integrated circuit package-in-package system for manufacture of the stacked integrated circuit package-in-package system in an embodiment of the present invention.

Referring now to FIG. 26, therein is shown a flow chart of a stacked integrated circuit package-in-package system 2600 for manufacture of the stacked integrated circuit package-in-package system 100 in an embodiment of the present invention. The system 2600 includes forming a first integrated circuit spacer package including a mold compound with a recess provided therein in a block 2602; stacking the first integrated circuit spacer package on an integrated circuit die on a substrate with the recess positioned therebetween in a block 2604; and attaching a first electrical interconnect extending from the recess and connected between the integrated circuit die and the substrate in a block 2606.

It has been discovered that the present invention thus has numerous aspects.

It has been discovered that the integrated circuit spacer package 102 serving as a spacer for a stacked configuration for numerous integrated circuits eliminates the need separate spacers, such as a silicon spacer, improving manufacturing yield and reducing cost of the stacked integrated circuit package-in-package system 100 by simplifying and reducing the manufacturing process.

It has also been discovered that the integrated circuit spacer package 102 serving as a spacer for a stacked configuration for numerous integrated circuits forms a lower height of the stacked integrated circuit package-in-package system 100.

It has further been discovered that the integrated circuit spacer package 102 and the stacked integrated circuit package-in-package system may be manufactured with existing equipments further reducing the manufacturing cost.

An aspect is that the present invention provides the encapsulation of the integrated circuit spacer package serves multiple functions. The encapsulation protects the integrated circuit die and electrical interconnects in the integrated circuit spacer package. The encapsulation also provides the clearance needed for stacking the integrated circuit spacer package above another device, such as another integrated circuit spacer package, a bare die, or another integrated circuit device, without damaging the electrical interconnects.

Another aspect of the present invention is that the encapsulation of the integrated circuit spacer package may be formed in a number of predetermined geometric shapes to accommodate different forms electrical interconnect, such as wire bond, flip chip, or a grid array interconnect.

Yet another aspect of the present invention is that the encapsulation of the integrated circuit spacer package may be formed with different predetermined geometric shapes and sizes to accommodate various die sizes.

Yet another aspect of the present invention is that the integrated circuit spacer package may additionally help reduce the stacked package height with aggressive thinning of the integrated circuit die in the integrated circuit spacer package. Different electrical interconnects, such as flip chip or reverse stitch stand-off bump (RSSB), may further reduce the height of the integrated circuit spacer package.

Yet another aspect of the present invention is that the integrated circuit spacer package may be formed of various configurations to work with different sizes, thickness, and electrical interconnect structures.

Yet another important aspect of the present invention is that it valuably supports and services the historical trend of reducing costs and increasing performance. These and other valuable aspects of the present invention consequently further the state of the technology to at least the next level.

Thus, it has been discovered that the stacked integrated circuit package-in-package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stacked integrated circuit package-in-package system comprising:
    forming a first integrated circuit spacer package including a mold compound with a recess provided therein wherein forming the first integrated circuit spacer package including a mold compound with the recess provided therein and having a beveled form;
    stacking the first integrated circuit spacer package on an integrated circuit die on a substrate with the recess positioned therebetween; and
    attaching a first electrical interconnect extending from the recess and connected between the integrated circuit die and the substrate.

2. The system as claimed in claim 1 wherein forming the first integrated circuit spacer package including a mold compound with the recess provided therein and having a stepped form.

3. The system as claimed in claim 1 wherein forming the first integrated circuit spacer package including a mold compound with the recess provided therein and having a curved form.

4. The system as claimed in claim 1 further comprising encapsulating the first integrated circuit spacer package, the integrated circuit die, and the first electrical interconnect.

5. A stacked integrated circuit package-in-package system comprising:
    forming a first integrated circuit spacer package including a mold compound and a carrier wherein forming the mold compound having the recess provided therein comprises:
        forming a top mold plate having an isolation recess in an isolation mask along an abscissa and a channel recess in a channel mask along an ordinate;
        filling the isolation recess and the channel recess with the mold compound to form an encapsulation;
        forming the encapsulation having a first side, formed in the channel recess, with an obtuse angle and the mold compound on the carrier below the channel mask; and
        forming the encapsulation having a second side, adjacent to the first side formed in the isolation recess, with the obtuse angle and the isolation mask on the carrier;
    forming the mold compound having a recess provided therein with a trapezoid prism shape having a carrier side, as a base of the trapezoid prism shape, wider than an attachment side, as a top of the trapezoid prism shape;
    stacking the first integrated circuit spacer package on an integrated circuit die on a substrate with the recess positioned therebetween; and
    attaching a first electrical interconnect extending from the recess and connected between the integrated circuit die and the substrate.

6. The system as claimed in claim 5 wherein forming the mold compound having the recess provided therein comprises:
    forming a top mold plate having a channel recess in a channel mask along an ordinate and an abscissa;
    filling the channel recess with the mold compound to form an encapsulation; and
    forming the encapsulation having a side, formed in the channel recess, with an obtuse angle and the mold compound on the carrier below the channel mask.

7. The system as claimed in claim 5 wherein forming the mold compound having the recess provided therein comprises:
- forming an individual mold cap having an injection hole and a recess;
- filling the recess through the injection hole with the mold compound to form an encapsulation; and
- forming the encapsulation having a side, formed in the recess, with an obtuse angle.

8. The system as claimed in claim 5 wherein forming the mold compound having the recess provided therein comprises:
- forming a planar mold cap and a molding recess; and
- filling the molding recess with the mold compound to form an encapsulation.

9. A stacked integrated circuit package-in-package system comprising:
- a first integrated circuit spacer package including a mold compound with a recess provided therein wherein the recess is a beveled, stepped, or curved form;
- the first integrated circuit spacer package on an integrated circuit die on a substrate with the recess positioned therebetween; and
- a first electrical interconnect extending from the recess and connected between the integrated circuit die and the substrate.

10. The system as claimed in claim 9 further comprising a package mold to cover the first integrated circuit spacer package, the integrated circuit die, and the first electrical interconnect.

11. The system as claimed in claim 9 wherein:
- the first integrated circuit spacer package including the mold compound with the recess provided therein serves as a spacer;
- the first integrated circuit spacer package on the integrated circuit die on the substrate with the recess positioned therebetween for a electrical connection to the integrated circuit die;
- the first electrical interconnect extending from the recess and connected between the integrated circuit die and the substrate;
- forming a first integrated circuit spacer package including a mold compound and a carrier; and further comprising:
- a carrier of the first integrated circuit package; and
- the mold compound has a trapezoid prism shape having a carrier side on the carrier, as a base of the trapezoid prism shape, wider than an attachment side, as a top of the trapezoid prism shape.

12. The system as claimed in claim 11 wherein the mold compound has a first side, along an ordinate, in an obtuse angle with the carrier exposed and a second side, along an abscissa and adjacent to the first side, in the obtuse angle with the substrate covered by the mold compound.

13. The system as claimed in claim 11 wherein the mold compound has a side with an obtuse angle and covers the carrier.

14. The system as claimed in claim 11 wherein the mold compound has a side with a curved shape.

15. The system as claimed in claim 11 wherein the mold compound has a side with a stepped shape.

* * * * *